United States Patent [19]

Welch et al.

[11] Patent Number: 5,425,894
[45] Date of Patent: Jun. 20, 1995

[54] POLYHYDROXYPOLYETHERS AS LOW FOAM SURFACTANTS

[75] Inventors: Michael C. Welch, Woodhaven; Jay G. Otten, Flat Rock; Glenis R. Schenk, Wyandotte, all of Mich.

[73] Assignee: BASF Corporation, Mt. Olive, N.J.

[21] Appl. No.: 94,654

[22] Filed: Jul. 19, 1993

Related U.S. Application Data

[63] Continuation of Ser. No. 805,670, Dec. 12, 1991, abandoned.

[51] Int. Cl.$^6$ .............................................. C11D 1/72
[52] U.S. Cl. ........................ 252/174.21; 252/174.15; 252/174.17; 252/DIG. 2; 252/DIG. 15; 568/625; 568/624
[58] Field of Search ............... 252/174.21, 174.15, 252/174.17, DIG. 2, DIG. 12, DIG. 15, DIG. 6; 568/625, 624, 613, 623; 514/844

[56] References Cited

FOREIGN PATENT DOCUMENTS

| | | | |
|---|---|---|---|
| 0018482 | 11/1980 | European Pat. Off. | ............ 568/623 |
| 1531010 | 6/1968 | France . | |
| 63-278542 | 11/1988 | Japan . | |
| 1180591 | 2/1970 | United Kingdom . | |

*Primary Examiner*—Olik Chaudhuri
*Assistant Examiner*—C. Everhart

[57] ABSTRACT

Polyhydroxypolyethers as low foam surfactants comprising a compound of the general formula $$R^1[O(CH_2CH_2O)_m(CH_2\overset{\overset{\displaystyle CH_3}{|}}{C}HO)_l R^2]_n \quad \text{I}$$

wherein
$R^1$ is a linear or branched $C_2$- to $C_{18}$-alkylene radical;
$R^2$ is H, $$-(CH_2-\overset{\overset{\displaystyle R^3}{|}}{C}H-O)_Z H \text{ or } -(CH_2-\overset{\overset{\displaystyle CH_2OR^4}{|}}{C}H-O)_Z H;$$

$R^3$, $R^4$ are linear or branched $C_2$ to $C_{18}$ alkyl radicals;
$Z$ is a number of from 1 to 3;
with the proviso that at least one $R^2$ is $$-(CH_2-\overset{\overset{\displaystyle R^3}{|}}{C}H-O)_Z H \text{ or } -(CH_2-\overset{\overset{\displaystyle CH_2OR^4}{|}}{C}H-O)_Z H;$$

$n$ is a number of from 2 to 8;
$m$ is a number of from 15 to 34; and
$l$ is a number of from 0 to 3.

These compounds are useful in cleaning compositions and rinse aids which are low foaming and biodegradable.

13 Claims, No Drawings

POLYHYDROXYPOLYETHERS AS LOW FOAM SURFACTANTS

This is a continuation of application Ser. No. 07/805,670 filed on Dec. 12, 1991, now abandoned.

FIELD OF THE INVENTION

The present invention is directed to polyhydroxypolyethers obtainable by the addition of one or more epoxides to polyoxyalkylene polyethers. The polyhydroxypolyethers of the present invention are useful as low-foaming, biodegradable surfactants in cleaning compositions and rinse aids.

BACKGROUND OF THE INVENTION

Nonionic surfactants based on polyoxyalkylene polyether derivatives are known in the art. These surfactants are used in cleaning compositions for cleaning hard surfaces, particularly for cleaning tableware and other utensils in machine dishwashers. The requirements for these nonionic surfactants are good cleaning, spotting and filming prevention, and good defoaming properties along with biodegradability.

In the U.S. Pat. No. 4,913,833 an automatic dishwashing detergent composition is disclosed comprising an active-chlorine compound and a sterically hindered epoxide-capped polyether polyol as a nonionic surfactant.

The U.S. Pat. No. 4,925,587 discloses specified derivatives of hydroxyalkyl polyalkylene glycol ethers for aqueous cleaning preparations for industrial and institutional purposes.

The U.S. Pat. No. 4,898,621 discloses a process of rinsing dishes and glassware in a dishwashing machine comprising a hydroxyalkyl polyethylene glycol ether. This patent is limited to the use of derivatives of polyethylene glycol ethers.

Some of these nonionic surfactants show improved results as foam-inhibiting agents but these properties are not fully sufficient for all cleaning applications.

Therefore, it was an object of the present invention to provide a nonionic surfactant for the use in cleaning compositions which show good cleaning properties, is low-foaming and in addition is biodegradable.

SUMMARY OF THE INVENTION

The object of the present invention has been achieved with a compound of the general formula I:

$$R^1[O(CH_2CH_2O)_m(CH_2\overset{\underset{|}{CH_3}}{C}HO)_l R^2]_n \qquad I$$

wherein
$R^1$ is a linear or branched $C_2$- to $C_{18}$-alkyl radical;
$R^2$ is H,

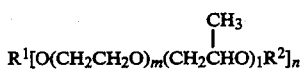

$R^3$, $R^4$ are linear or branched $C_2$- to $C_{18}$-alkyl radicals;
Z is a number of from 1 to 3; with the proviso that at least one $R^2$ is

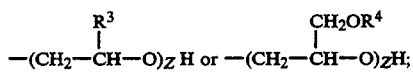

n is a number of from 2 to 8;
m is a number of from 15 to 45 and
l is a number of from 0 to 3.

DETAILED DESCRIPTION OF THE INVENTION

The nonionic surfactants of the present invention are compounds of the general formula I:

$$R^1[O(CH_2CH_2O)_m(CH_2\overset{\underset{|}{CH_3}}{C}HO)_l R^2]_n \qquad I$$

wherein
$R^1$ is a linear or branched $C_2$- to $C_{18}$-alkyl radical;
$R^2$ is H,

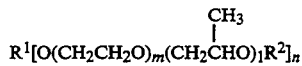

$R^3$, $R^4$ are linear or branched $C_2$- to $C_{18}$-alkyl radicals;
Z is a number of from 1 to 3, with the proviso that at least one $R^2$ is

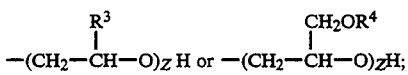

n is a number of from 2 to 8;
m is a number of from 15 to 45 and
l is a number of from 0 to 3.

Preferred are compounds of the formula I wherein
$R^1$ is a linear or branched $C_2$- to $C_{12}$-alkyl radical
$R^3$, $R^4$ are linear or branched $C_6$-$C_{16}$ alkyl radicals
n is a number of from 2 to 6;
m is a number of from 15 to 45 and
l is a number of from 0 to 3.

Most preferred are compounds, wherein $R^1$ is a linear or branched $C_2$- to $C_3$-alkyl radical;
$R^3 R^4$ are linear or branched $C_6$- to $C_{16}$-alkyl radicals;
n is a number of from 2 to 3;
m is a number of from 15 to 45 and
l is a number of from 1 to 3.

The $R^1$ alkyl radical is derived from polyhydroxy compounds with a hydroxy functionality of from 2 to 8 like ethylene glycol, propylene glycol, butylene glycol, neopentyl glycol, trimethylol propane, trimethylol ethane, glycerol, 1,2,6-hexanetriol, pentaerythritol, dipentaerythritol, glucose, sorbitol and sucrose.

Preferred are ethylene glycol, propylene glycol and trimethylol propane.

Suitable $R^3$ and $R^4$ substituents include radicals like ethyl, n-propyl, n-butyl, n-pentyl, n-hexyl, n-heptyl, n-octyl, n-nonyl, n-decyl, n-undecyl, n-dodecyl, n-tridecyl, n-tetradecyl, n-pentadecyl, n-hexadecyl, n-heptadecyl, n-octadecyl and branched isomers of these alkyl radicals or the residue from soya bean oil epoxides.

For the preparation of the compounds of the general formula I the related polyhydroxy compound is reacted first with ethylene oxide, propylene oxide or mixtures thereof followed by a reaction with $C_4$- to $C_{18}$-epoxides, $C_4$- to $C_{18}$-alkyl glycidyl alkyl ethers or mixtures thereof.

Suitable $C_4$- to $C_{18}$-epoxides are 1,2-epoxybutane, 1,2-epoxypentane, 1,2-epoxyhexane, 1,2-epoxyheptane, 1,2-epoxyoctane, 1,2-epoxydecane, 1,2-epoxydodecane, 1,2-epoxytetradecane, 1,2-epoxyhexadecane, 1,2-epoxyoctadecane, soya bean oil epoxides or mixtures thereof.

Preferred are 1,2-epoxydecane and 1,2-epoxydodecane.

Some of these products are commercially available under the Trade Name VIKOLOX® from ATOCHEM. These epoxides are known and formed by epoxidation of long chain alfa-monoolefins or soya bean oil.

Suitable alkyl glycidyl ethers are methyl glycidyl ether, ethyl glycidyl ether, n-propyl glycidyl ether, n-butyl glycidyl ether, n-pentyl glycidyl ether, n-hexyl glycidyl ether, n-heptyl glycidyl ether, n-octyl glycidyl ether, n-nonyl glycidyl ether, n-decyl glycidyl ether, n-undecyl glycidyl ether, n-dodecyl glycidyl ether, n-tridecyl glycidyl ether, n-tetradecyl glycidyl ether, n-pentadecyl glycidyl ether, n-hexadecyl glycidyl ether, n-heptadecyl glycidyl ether, n-octadecyl glycidyl ether, and branched isomers of these alkyl glycidyl ethers like i-propyl glycidyl ether, i-butyl glycidyl ether, sec. butyl glycidyl ether and the like.

Preferred are n-octyl glycidyl ether, n-decyl glycidyl ether, and n-dodecyl glycidyl ether.

The reaction between the polyhydroxy compound and the ethylene oxide, propylene oxide or mixtures thereof takes place in the presence of an alkaline catalyst. Examples include alcohol alkoxylate of metal hydroxyde like sodium hydroxide or potassium hydroxide. The resulting alkoxylated compounds have molecular weight of from about 300 to about 10,000, preferably from about 600 to about 2,000.

This alkoxylated polyhydroxy compound is reacted with the $C_4$-to $C_{18}$-epoxide, $C_4$- to $C_{18}$-alkyl glycidyl ether or mixtures thereof in the presence of the alkaline catalyst described above.

The molar ratio between the alkoxylated polyhydroxy compound and the epoxide or alkyl glycidyl ether is in the range of from about 1 to 9:1, preferably from 1 to 3:1.

The reaction temperature is from about 100° to 200° C., preferably 120° to 180° C. for a time period of from about 1 to about 8 hours. The end of the reaction is determined by a low level of epoxy content. The resulting products are compounds of the Formula I.

The compounds of the present invention are useful in cleaning compositions and rinse aids for cleaning of plastics, metal, glass, and ceramics.

The cleaning compositions show good cleaning properties, are very low foaming and in addition the compounds of the general Formula I are biodegradable.

EXAMPLE 1

To a suitable reaction vessel was placed 500 grams of 840 MW (molecular weight) polyethylene glycol containing 1 mole propylene oxide and 1.0 gram 90% potassium hydroxide. The mixture was heated to 120° C. under vacuum to remove volatiles. The vacuum was relieved, the temperature raised to 150° C., and 197 grams 1,2 epoxydecane (VIKOLOX® 10 epoxide, ATOCHEM) added. Work-up gave 622 grams of a light brownish/orange liquid.

EXAMPLE 2

To a suitable reaction vessel was placed 505 grams of 840 MW trimethylolpropane-initiated polyethylene glycol containing 3 moles propylene oxide and 6.1 grams of potassium t-butoxide. The mixture was heated to 150° C. and 97 grams VIKOLOX® 10 epoxide added. Work-up gave 523 grams or a light brownish/yellow liquid.

EXAMPLE 3

To a suitable reaction vessel was placed 506 grams of trimethylolpropane-initiated polyethylene glycol containing 3 moles propylene oxide and 7.0 grams of potassium t-butoxide. The mixture was heated to 150° C. and 187 grams VIKOLOX® 10 epoxide added. Work-up gave 628 grams of a light brownish/yellow liquid.

TABLE 1

| Physical Properties: | Example 1 | Example 2 | Example 3 |
|---|---|---|---|
| 1% Aqueous Cloud Point | 7° C. | 37° C. | 15° C. |
| 0.1% Aqueous Surface Tension | 28.7 dyne/cm | 29.1 dyne/cm | 29.0 dyne/cm |
| Ross-Miles Foam Height | | | |
| Time = 0 minutes | 2 | 10 | 0 |
| Time = 5 minutes | 0 | 3 | 0 |
| Epoxy value | <0.1 | <0.1 | <0.1 |

Test in a cleaning composition:
PROTEIN SOIL DEFOAMING TEST

| Test conditions: | Hobart ® UMP Dishwasher Temp. 120° F. 3 Cycles/Surfactant Cycle 1 - no Soil Cycle 2 - Milk Soil Cycle 3 - Egg Soil 20 grams machine dishwashing detergent containing 3 WT % Surfactant Milk Soil - 12g CARNATION ® Brand Powdered Milk Egg Soil - 15g blended raw egg |
|---|---|

The detergent or detergent and soil are placed in the dishwasher. The spray arm rotation speed is measured during the wash cycle.

Machine Dishwashing Detergent formulation containing test surfactant:

| | WEIGHT % |
|---|---|
| Surfactant | 3.0 |
| Sodium Tripolyphosphate Hexahydrate | 44.0 |
| Sodium Carbonate | 20.0 |
| Sodium Metasilicate Pentahydrate | 20.0 |
| Sodium Sulfate | 11.5 |
| Chlorinated Isocyanurate | 1.5 |

| SURFACTANT | | SPRAY ARM SPEED RPM | % EFFICIENCY VERSUS WATER BLANK | FOAM HEIGHT AT END OF WASH CYCLE |
|---|---|---|---|---|
| Example 1 | no soil | 60 | 92 | ¼" |
| | milk soil | 58 | 90 | ¼" |
| | egg soil | 55 | 85 | 1" |
| Example 2 | no soil | 63 | 95 | <¼" |
| | milk soil | 59 | 89 | ¼" |
| | egg soil | 42 | 63 | 1¾" |
| Example 3 | no soil | 60 | 92 | <¼" |

| SURFACTANT | SPRAY ARM SPEED RPM | % EFFICIENCY VERSUS WATER BLANK | FOAM HEIGHT AT END OF WASH CYCLE |
|---|---|---|---|
| milk soil | 59 | 89 | ¼" |
| egg soil | 54 | 82 | ¼" |

TEST IN A RINSE AID

SPOTTING & FILMING PERFORMANCE

Hobart AM-11 commercial dishwasher
Test Conditions: wash 150°–160° F., rinse 180° F.
400 PPM rinse aid: 20% Surfactant/2% Monawet ® MM80 Hydrotrope (Sodium dihexyl sulfosuccinate) unless otherwise noted
2400 PPM chlorinated detergent (no surfactant added)
600 PPM 80% Margarine/20% powdered milk soil

| SAMPLE | WASH FOAM | RINSE FOAM | AVE. FILM/STREAK |
|---|---|---|---|
| no rinse aid | 1¾" | ¾" | 4.0 |
| Example 1 | scattered | trace | 2.8 |
| Example 2 | 1½" | 1" | 2.4 |
| Example 3 | 1" | ½" | 3.1 |

Rating Scale
1 = no film
to 5 = heavy film

I claim:

1. A compound of the general formula $$R^1[O(CH_2CH_2O)_m(CH_2CHO)_l R^2]_n$$
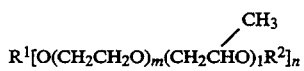

wherein
$R^1$ is a linear or branched $C_2$- to $C_{18}$-alkyl radical;

$R^2$ is H, $-(CH_2-CH(R^3)-O)_z H$ or $-(CH_2-CH(CH_2OR^4)-O)_z H$ ;
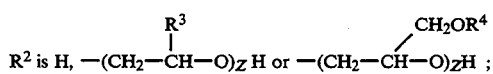

$R^3$, $R^4$ are linear or branched $C_2$- to $C_{18}$-alkyl radicals;

Z is a number of from 1 to 3; with the proviso that at least one $R^2$ is $-(CH_2-CH(R^3)-O)_z H$ or $-(CH_2-CH(CH_2OR^4)-O)_z H$ ;
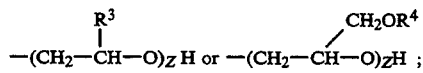

n is a number of from 2 to 8;
m is a number of from 15 to 45; and
l is a number of from 0 to 3, said compound having a Ross - Miles Foam Height not exceeding 3 millimeters after 5 minutes.

2. The compound according to claim 1, wherein $R^1$ is a linear or branched $C_2$- to $C_{12}$-alkyl radical.

3. The compound according to claim 1, wherein $R^1$ is a linear or branched $C_2$- to $C_3$-alkyl radical.

4. The compound according to claim 1, wherein $R^3$, $R^4$ are linear or branched $C_6$- to $C_{16}$-alkyl radicals.

5. The compound according to claim 1, wherein n is a number of 2 to 6.

6. The compound according to claim 1, wherein n is a number of 2 to 3.

7. The compound according to claim 2, wherein $R^3$, $R^4$ are linear or branched $C_6$- to $C_{16}$-alkyl radicals;
n is a number of 2 to 6;
m is a number of from 15 to 45; and
l is a number of from 0 to 3.

8. The compound according to claim 3, wherein $R^3$, $R^4$ are linear or branched $C_6$- to $C_{16}$-alkyl radicals;
n is a number of 2 to 3;
m is a number of from 15 to 45; and
l is a number of from 1 to 3.

9. A cleaning composition, comprising at least one alkali metal salt and a compound according to claim 1 as a surfactant.

10. A rinse aid, comprising at least one alkali metal salt and a compound according to claim 1 as a surfactant.

11. The compound as claimed in claim 1, wherein said compound has a Ross - Miles Foam Height not exceeding 10 millimeters after 0 minutes.

12. A compound which is the reaction product of trimethylolpropane-initiated polyethylene glycol with propylene oxide and potassium t-butoxide, further reacted with 1,2 epoxydecane, said compound having a Ross - Miles Foam Height not exceeding 3 millimeters after 5 minutes.

13. The compound as claimed in claim 12, wherein said compound has a Ross - Miles Foam Height not exceeding 10 millimeters after 0 minutes.

* * * * *